(12) United States Patent  
Curnalia et al.

(10) Patent No.: US 8,149,586 B2
(45) Date of Patent: Apr. 3, 2012

(54) KEYING MECHANISM FOR CONNECTOR DAMAGE PREVENTION

(75) Inventors: Michael Allen Curnalia, Tucson, AZ (US); Kenji Hidaka, Yokohama (JP); Michihiro Okamoto, Kawasaki (JP); Yasuhiro Yamamoto, Kawasaki (JP); Takeshi Wagatsuma, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 12/355,642

(22) Filed: Jan. 16, 2009

(65) Prior Publication Data

US 2010/0182754 A1    Jul. 22, 2010

(51) Int. Cl.
*H01R 12/16* (2006.01)
(52) U.S. Cl. ........ 361/786; 361/686; 361/726; 361/730; 361/747; 361/752; 439/61; 439/76.1; 439/79; 439/368; 439/676; 385/75; 710/301
(58) Field of Classification Search ............... 361/786, 361/686, 726, 730, 747, 752; 439/61, 76.1, 439/79, 368, 676; 385/75; 710/301
See application file for complete search history.

(56) References Cited

U.S. PATENT DOCUMENTS

| 4,821,145 | A | 4/1989 | Corfits et al. |
| 5,118,904 | A | 6/1992 | Nguyenngoc |
| 5,751,558 | A | 5/1998 | Gullicksrud et al. |
| 6,771,514 | B1 | 8/2004 | Elg |
| 6,876,547 | B2 | 4/2005 | McAlister |
| 7,272,012 | B2 | 9/2007 | Salinas et al. |

*Primary Examiner* — Xiaoliang Chen
(74) *Attorney, Agent, or Firm* — GSS Law Group

(57) ABSTRACT

A tray keying mechanism is mounted on a backplane inside a modular chassis and has a protrusion that stands out like a post for each of several equipment bays. A modular tray can be inserted into each of the equipment bays, but it will not be allowed to be fully inserted and to engage the electrical connectors on the backplane if the corresponding post meets an obstruction on the rear apron of the tray. If the particular tray is the correct type, and is not upside down, the post will encounter no obstructions during the insertion of the tray, and the electrical connectors will be allowed to engage. In one embodiment, the keying mechanism comprises a bracket of molded plastic that fits all around the several connectors on the backplane, and could be patterned to fit an already existing and in-service backplane and chassis.

18 Claims, 4 Drawing Sheets

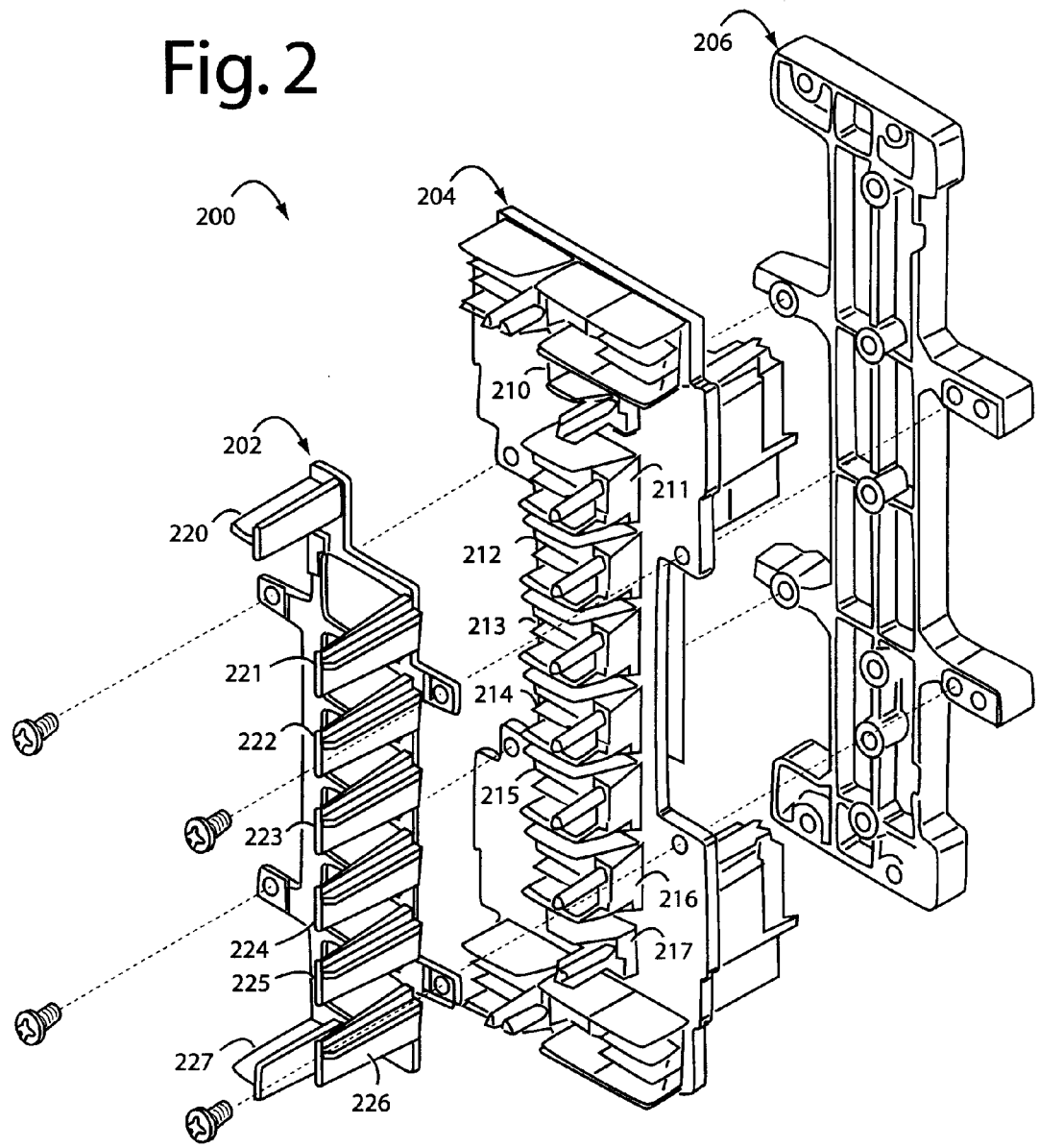

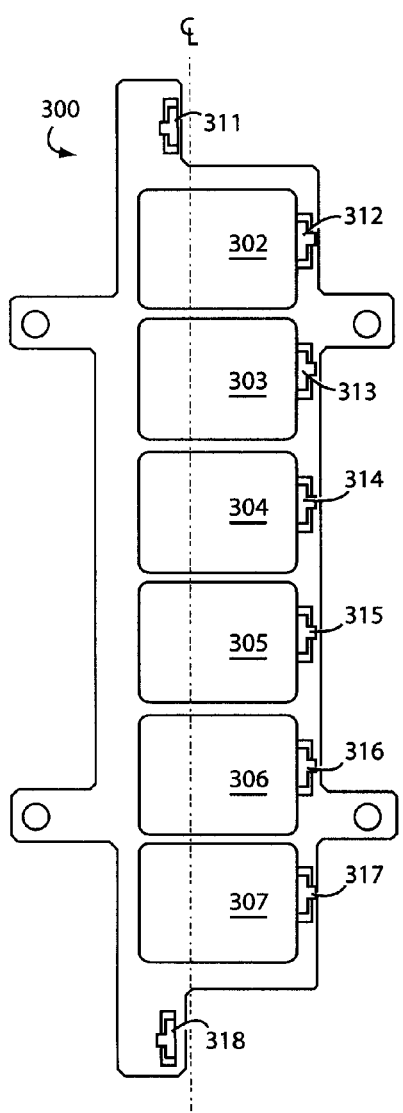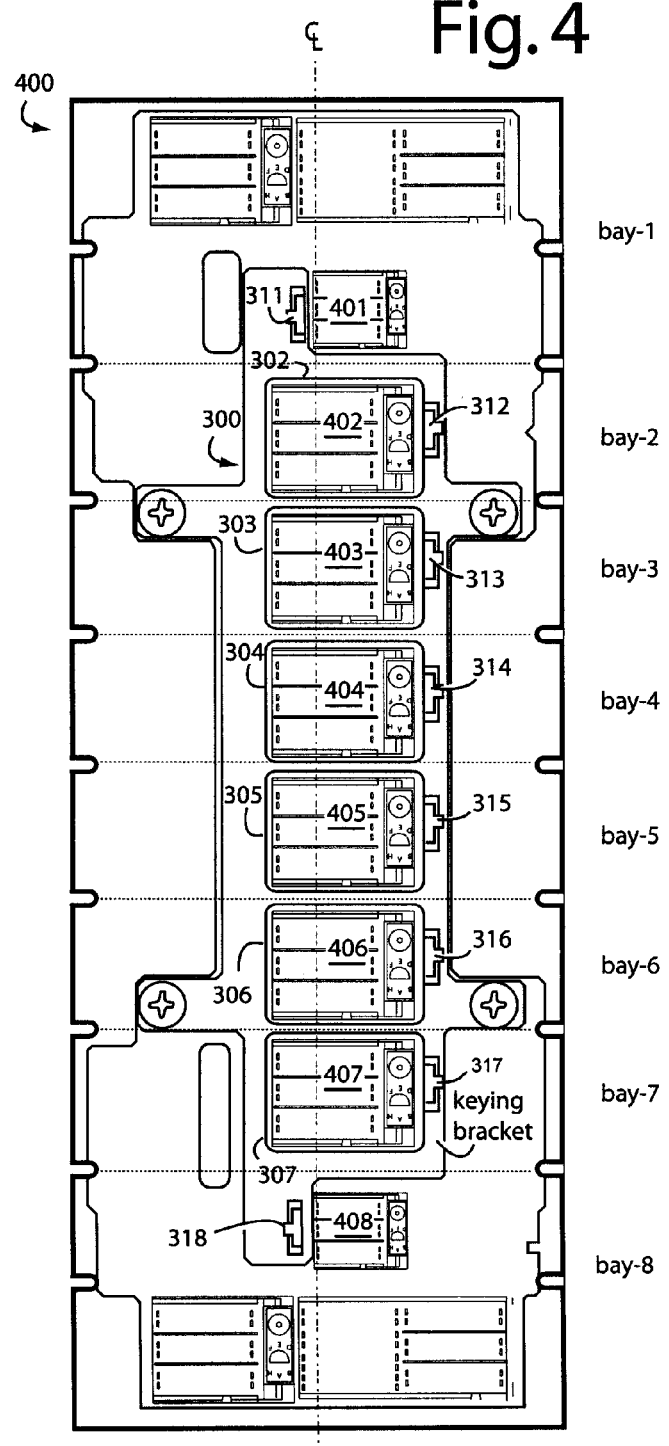

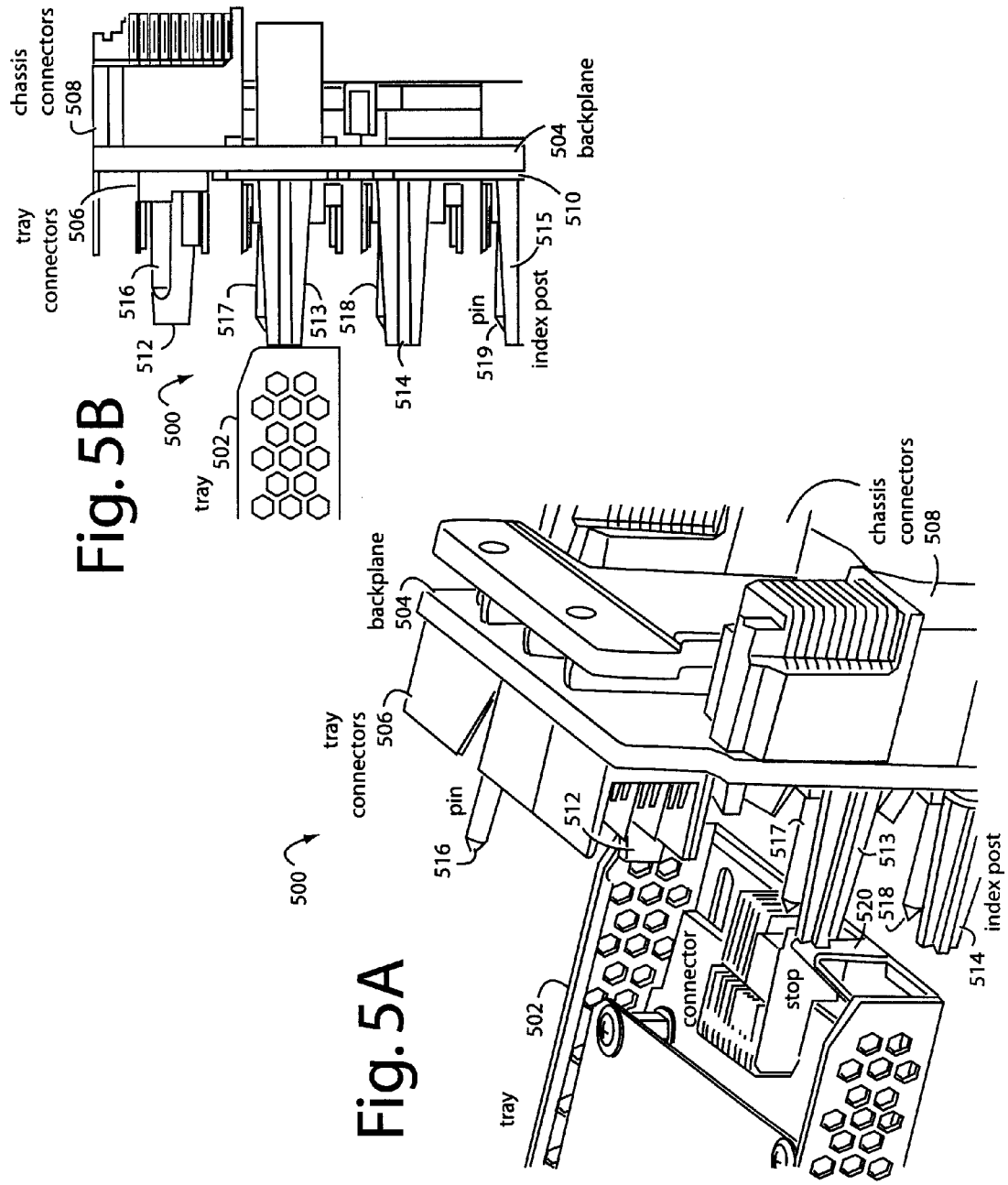

KEYING MECHANISM FOR CONNECTOR DAMAGE PREVENTION

FIELD OF THE PRESENT INVENTION

The present invention relates to electrical connectors, and in particular to accessory keying mechanisms to protect card and backplane connectors used in modular computer systems by making sure the correct trays can only be fully inserted into the right positions in a chassis of trays.

BACKGROUND

Typical servers and storage products are usually built on a backplane card structure. Interconnection bays are provided for disk drives, controllers, communication cards, and other plug-in modules. A few types of backplane cards depend on high density connectors with polarizing pins and guide pins to assure the proper connection of modules.

One type of conventional polarizing pin is D-shaped, and several of these can be arranged in unique combinations simply by changing the orientations of the D-shaped pins and holes. The worth of this is limited to cases where the same size and types of connectors are used throughout a system. No advantage is provided in case of wrong combinations where different sizes and types of connectors are used, and such connectors and systems can be damaged if a wrong connection is attempted by mistake. Upside down installation of modules installed into the system's bays is also a source of trouble.

What is needed is a connector system that has its unique keying mechanism against any wrong connection or operation, and that can protect products from any damages of connectors and systems. This keying mechanism should be simple and inexpensive, and not degrade in operability. It should be widely applicable to any size/type of connectors being used on backplane card structure and modules.

SUMMARY OF THE PRESENT INVENTION

A keying mechanism is mounted on a backplane inside a modular chassis and has a protrusion that stands out like a post for each of several equipment bays. A modular tray can be inserted into each of the equipment bays, but it will not be allowed to be fully inserted and to engage the electrical connectors on the backplane if the corresponding post meets an obstruction on the rear apron of the tray. If the particular tray is the correct type, and is not upside down, the post will encounter no obstructions during the insertion of the tray, and the electrical connectors will be allowed to engage. In one embodiment, the keying mechanism comprises a bracket of molded plastic that fits all around the several connectors on the backplane, and could be patterned to fit an already existing and in-service backplane and chassis.

The above summary of the invention is not intended to represent each disclosed embodiment, or every aspect, of the invention. Other aspects and example embodiments are provided in the figures and the detailed description that follow.

BRIEF DESCRIPTION OF THE DRAWINGS

The present invention may be more completely understood in consideration of the following detailed description of various embodiments of the invention in connection with the accompanying drawings, in which:

FIG. 2 is an exploded assembly diagram in a perspective view of the backplane and support of FIG. 1, and shows how the keying mechanism embodiment can be installed in new or existing designs;

FIG. 3 is a plan view diagram of a keying mechanism embodiment that could be used in the IDEB chassis of FIG. 1 and backplane of FIG. 2;

FIG. 4 is a plan view diagram of the keying mechanism embodiment of FIG. 3 mounted on a backplane and support inside an IDEB chassis, looking directly down into the front where modular equipment trays can be loaded; and FIGS. 5A and 5B are a perspective view and a side view of one modular tray being stopped by a keying mechanism embodiment mounted on a backplane and support inside an IDEB chassis, similar to those shown in FIGS. 1-4.

Figure 1:
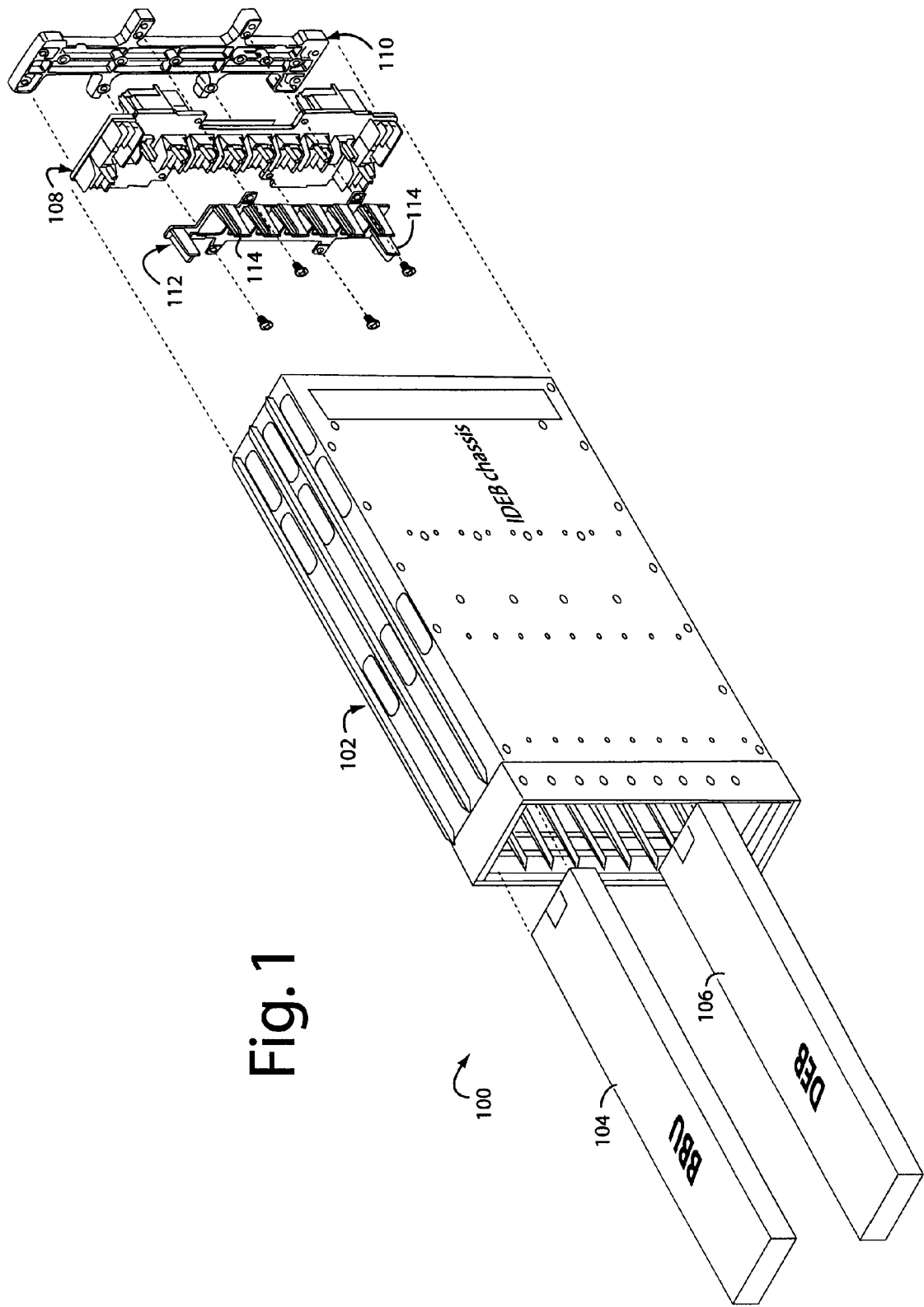
FIG. 1 is an exploded assembly diagram in a perspective view of an integrated drive enclosure blade (IDEB) chassis embodiment for combinations of battery backup units (BBU) trays, controller trays, and drive enclosure blade (DEB) trays, and where such trays are prevented from plugging into the wrong backplane connectors by a keying bracket.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

FIG. 1 shows an eight-bay partitioned modular chassis and tray system 100, in an embodiment that includes an integrated drive enclosure blade (IDEB) chassis 102 for combinations of battery backup unit (BBU) trays 104 and drive enclosure blade (DEB) trays 106. The IDEB type of chassis and trays illustrated here are merely examples of modular chassis that can benefit from the embodiments described here.

Trays 104 and 106 are prevented from being plugged into the wrong connectors on a backplane circuit board 108 and support 110 by a keying mechanism 112. Several indexing posts 114 molded into the keying bracket 112 protrude out further than any guide pins on the individual connectors they are associated with, and will stop against the rear apron of trays 104 and 106 if no relief slot in the rear apron is in the corresponding position.

The embodiments help to prevent inadvertent connector damage, and operate to foolproof the setup, operation and maintenance work of servers and storage products by preventing BBU trays and DEB trays from being fully inserted if the types are interchanged or upside down. The keying mechanism 112 simply comprises a single plastic injection molded piece screwed onto the front of the backplane circuit board 108. The keying mechanism 112 prevents connector damage by blocking attempts to seat very different tray plug types into the backplane receptacles. Expensive polarized connector types are therefore not necessary, and the keying mechanism 112 can even be retrofitted to preexisting connector plugs and receptacles.

FIG. 2 provides more detail on the backplane and keying mechanism of FIG. 1. A backplane assembly 200 includes an eight-connector keying mechanism 202 that screws onto the face of a backplane circuit board 204. The keying mechanism 202 is patterned to fit around any other components mounted on the face of backplane circuit board 204. A support 206 is mounted behind the backplane circuit board 204, and helps to relieve the pressures applied to the backplane when various trays are plugged into receptacles 210-217. A corresponding set of index posts 220-227 are positioned next to each of the connector receptacles 210-217. These will only allow the plug on a tray to reach the receptacle 210-217 on the backplane circuit board 204 if the respective index post 220-221 fits a matching hole in the rear apron of the tray. Otherwise, the index post acts as a standoff bumper and prevents further insertion of the tray that could damage any of connector receptacles 210-217. Guide pins on each connector receptacle 210-217 are shorter than the associated index post 220-227.

In FIG. 3, a keying mechanism 300 includes six rectangular cutouts 302-307 to clear a corresponding set of backplane receptacle connectors. See, FIG. 4. Eight index posts 311-318 protrude out lateral and next to the connector positions, and each acts to block trays that do not match the respective positions. The keying mechanism 300 can be cast or molded from plastic or metal alloy, and is therefore inexpensive to manufacture in volumes. The number and arrangement of the rectangular cutouts 302-307, and the size and placement of the index posts 311-318 is dependent on the particular chassis and backplane applications. The keying mechanism here is described in the context of a current Integrated Disk Enclosure Blade (IDEB) as a workable example of this invention. IDEB has backplane circuit board inside at rear, and can contain ten detachable modules in front. Tray assemblies are available for those detachable modules with hard disk drives, battery back-up units, or controllers installed.

FIG. 4 shows how keying mechanism 300 can be installed in a chassis and backplane circuit board 400 with eight bays. In this example, the top and bottoms bays, bay-1 and bay-8, provide for BBU type trays. The middle six bays, bay-2 through bay-7, provide for controller and DEB type trays. Other arrangements and types are possible, the exact configuration shown in FIG. 4 is merely for describing and illustrating the embodiments.

The centerline (CL) is shown in FIGS. 3 and 4 to illustrate how the chassis and backplane circuit board can be protected from the upside-down and wrong bay insertion of trays. The off-center index posts 311-318 will contact the rear aprons of the upside-down trays and find an obstruction. The obstruction can be engineered, as in new designs, or fortuitous as in preexisting designs. The connectors are thereby not allowed to even come close together if the match is wrong. If this were not the case, any protruding guide pins from the connector receptacles 401-408 could spear into the delicate electrical contacts in the connector plugs on the modular trays and cause serious damage quite inadvertently. In the example of FIG. 4, eight connector receptacles 401-408 align inside the cutouts 302-307 and next to the index posts 311-318 of keying mechanism 300.

FIGS. 5A and 5B illustrate a connector protection system 500 in which a tray 502 has been inserted the wrong way into a chassis. A backplane circuit board 504 within a chassis has several tray connectors 506 on the side facing the trays 502 and chassis connectors 508 on the opposite side. A bracket 510 mounts in and amongst the tray connectors 506, and has several protruding posts 512-515. These posts 512-515 are each longer that the corresponding guide pins 516-519 protruding from each adjacent tray connector. In FIG. 5A, post 513 can be seen contacting a stop 520, or other obstruction, built into a rear apron of tray 502, e.g., because the BBU tray shown is wrong for this particular DEB position.

Embodiments can relieve at least one of the principal reasons to use expensive polarizing connector plugs and receptacles in new designs. In older designs, a wide variety of existing backplane circuit boards, connector plugs and receptacles can be retrofitted quickly and easily. In some instances, the preexisting features of the rear aprons of the trays to be used can be adopted for service with the index posts. In new designs, special features and placements can be incorporated into the rear aprons of trays to best accommodate the purposes of the index posts.

In general, a keying mechanism is mounted on a backplane circuit board inside a modular chassis and has a protrusion that stands out like a post for each of several equipment bays. A modular tray can be inserted into each of the equipment bays, but it will not be allowed to be fully inserted and to engage the electrical connectors on the backplane circuit board if the corresponding post meets an obstruction on the rear apron of the tray. If the particular tray is the correct type, and is not upside down, the post will encounter no obstructions during the insertion of the tray, and the electrical connectors will be allowed to engage. In one embodiment, the keying mechanism comprises a bracket of molded plastic that fits all around the several connectors on the backplane circuit board, and could be patterned to fit an already existing and in-service backplane circuit board and chassis. In other embodiments, the bracket and posts are constructed of a single cast or injection-molded piece of plastic or metal alloy.

While the invention has been described with reference to several particular example embodiments, those skilled in the art will recognize that many changes may be made thereto without departing from the spirit and scope of the invention, which is set forth in the following claims.

The invention claimed is:

1. A tray keying mechanism, comprising:
   a bracket for mounting on the face of a backplane inside a modular chassis;
   a patterning of the bracket such that it will fit around a number of connector receptacles on said backplane, and that spans across a plurality of bays in said chassis that accommodate a plurality of modular equipment trays; and
   a plurality of posts disposed on the bracket that protrude out from said backplane, and wherein one of each post is associated with a particular one of the number of connector receptacles in a bay shared between them;
   wherein, no obstructions on a rear apron of a particular tray that is being inserted into a particular bay of the chassis will be encountered by the respective post on the bracket if such tray is a correct type and is correctly oriented for its final engagement with its corresponding connector receptacle on said backplane.

2. The tray keying mechanism of claim 1, wherein one of the plurality of posts will contact an obstruction on a rear apron of a particular tray that is being inserted into a particular bay of the chassis if such tray is not a correct type or is not correctly oriented for its final engagement with its corresponding connector receptacle on said backplane.

3. The tray keying mechanism of claim 1, further comprising:
   an extended length of the plurality of posts that protrudes further out than any other part of a corresponding connector receptacle in a bay shared between them.

4. The tray keying mechanism of claim 1, wherein the bracket and posts are constructed of a single cast or injection-molded piece of plastic or metal alloy.

5. The tray keying mechanism of claim 1, wherein the posts protrude further than any guide pin included in said number of connectors to protect a connector in a tray from being damaged by the guide pins.

6. The tray keying mechanism of Claim 1, wherein the posts are placed off-center of any trays.

7. The tray keying mechanism of Claim 1, wherein the bracket is patterned to clear any other components mounted on the face of said backplane.

8. The tray keying mechanism of claim 1, wherein the posts are distributed amongst said number of connector receptacles on said backplane, and the whole number of which spans across said plurality of bays in said chassis to accommodate said plurality of modular equipment trays.

9. The tray keying mechanism of claim 1, wherein:
one of the plurality of posts will contact an obstruction on a rear apron of a particular tray that is being inserted into a particular bay of the chassis if such tray is not a correct type or is not correctly oriented for its final engagement with its corresponding connector receptacle on said backplane;
an extended length of the plurality of posts that protrudes further out than any other part of a corresponding connector receptacle in a bay shared between them;
the bracket and posts are constructed of a single cast or injection-molded piece of plastic or metal alloy;
the posts protrude further than any guide pin included in said number of connectors to protect a connector in a tray from being damaged by the guide pins;
the posts are placed off-center of any trays;
the bracket is patterned to clear any other components mounted on the face of said backplane; and
the posts are distributed amongst said number of connector receptacles on said backplane, and the whole number of which spans across said plurality of bays in said chassis to accommodate said plurality of modular equipment trays.

10. An integrated disk enclosure blade (IDEB) chassis system, comprising:
a chassis for accommodating a plurality of equipment trays in a plurality of bays partitioned in the chassis;
a backplane for interconnection of any equipment trays installed in the chassis;
a plurality of connectors each disposed on the backplane for electrical connection between the backplane and any equipment tray installed in a bay shared by them;
a keying bracket mounted on the front of the backplane and inside the chassis;
a patterning of the keying bracket such that it will fit around a number of connector receptacles on the backplane, and that spans across the plurality of bays in the chassis;
a plurality of posts disposed on the keying bracket that protrude out from the backplane, wherein one of each post is associated with a particular one of the number of connectors in a bay shared between them;
wherein, obstructions on a rear apron of any equipment tray that is being inserted into a particular bay of the chassis will be encountered by the respective post on the bracket if such tray is not a correct type and is not correctly oriented for its final engagement with its corresponding connectors on the backplane.

11. The IDEB chassis of claim 10, wherein one of the plurality of posts will contact an obstruction on a rear apron of a particular tray that is being inserted into a particular bay of the chassis if such tray is not a correct type or is not correctly oriented for its final engagement with its corresponding connector on said backplane, 12. The IDEB chassis of claim 10, further comprising:
an extended length of the plurality of posts that protrudes further out than any other part of a corresponding connector in a bay shared between them.

13. The IDEB chassis of claim 10, wherein the bracket and posts are constructed of a single cast or injection-molded piece of plastic or metal alloy.

14. The IDEB chassis of claim 10, wherein the posts protrude further than any guide pin included in said number of connectors to protect a connector in a tray from being damaged by the guide pins.

15. The IDEB chassis of claim 10, wherein the posts are placed laterally off-center of any modular equipment trays.

16. The IDEB chassis of claim 10, wherein the bracket is patterned to clear any other components mounted on the face of said backplane.

17. The IDEB chassis of claim 10, wherein the posts are distributed amongst said number of connectors on said backplane, and the whole number of which spans across said plurality of bays in said chassis to accommodate said plurality of modular equipment trays, 18. The IDEB chassis of claim 10, wherein:
one of the plurality of posts will contact an obstruction on a rear apron of a particular tray that is being inserted into a particular bay of the chassis if such tray is not a correct type or is not correctly oriented for its final engagement with its corresponding connector on said backplane;
an extended length of the plurality of posts that protrudes further out than any other part of a corresponding connector in a bay shared between them;
the bracket and posts are constructed of a single cast or injection-molded piece of plastic or metal alloy;
the posts protrude further than any guide pin included in said number of connectors to protect a connector in a tray from being damaged by the guide pins;
the posts are placed off-center of any trays;
the bracket is patterned to clear any other components mounted on the face of said backplane; and
the posts are distributed amongst said number of connectors on said backplane, and the whole number of which spans across said plurality of bays in said chassis to accommodate said plurality of modular equipment trays.

* * * * *